(12) United States Patent
Koike (10) Patent No.: US 7,579,877 B2
(45) Date of Patent: Aug. 25, 2009

(54) COMPARATOR

(75) Inventor: Hideharu Koike, Yokohama (JP)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 11/203,096

(22) Filed: Aug. 15, 2005

(65) Prior Publication Data

US 2007/0035334 A1    Feb. 15, 2007

(51) Int. Cl.
*H03K 5/22* (2006.01)
(52) U.S. Cl. .......................... 327/65; 327/63
(58) Field of Classification Search .............. None
See application file for complete search history.

(56) References Cited

U.S. PATENT DOCUMENTS

| | | | |
|---|---|---|---|
| 5,563,598 A | 10/1996 | Hickling | |
| 5,764,086 A | 6/1998 | Nagamatsu et al. | |
| 5,828,241 A * | 10/1998 | Sukegawa | 327/67 |
| 6,172,535 B1 | 1/2001 | Hopkins | |
| 6,452,429 B1 * | 9/2002 | Lim | 327/108 |
| 6,486,722 B2 * | 11/2002 | Yamauchi | 327/270 |
| 6,778,014 B2 | 8/2004 | Rennig | |
| 2003/0132785 A1 | 7/2003 | Hunt | |
| 2004/0108879 A1 | 6/2004 | Choi | |
| 2004/0124888 A1 * | 7/2004 | Radelinow | 327/65 |
| 2005/0174149 A1 * | 8/2005 | Hu | 327/65 |
| 2005/0179469 A1 * | 8/2005 | Kasanyal et al. | 327/65 |

* cited by examiner

*Primary Examiner*—Lincoln Donovan
*Assistant Examiner*—Khareem E. Almo
(74) *Attorney, Agent, or Firm*—Finnegan, Henderson, Farabow, Garrett & Dunner LLP (57) ABSTRACT

A comparator according to one embodiment includes first and second input terminals, first and second output terminals, first and second input inverters, first and second load inverters, and a bias control circuit to provide first and second bias voltages for application to inputs of the first and second load inverters, respectively.

6 Claims, 5 Drawing Sheets

COMPARATOR

DESCRIPTION OF THE INVENTION

1. Field of the Invention

This invention relates to a comparator.

2. Background of the Invention

Low voltage differential signaling (LVDS) interfaces are becoming increasingly important in large-scale integration (LSI) for consumer products to reduce power consumption and to improve noise immunity and signal integrity. However, the input and supply voltage ranges of conventional CMOS comparators implemented in such interfaces do not satisfy the requirements of LVDS receivers. LVDS receivers require a wide input range (rail-to-rail) that not only rejects small amounts of noise on a transmission line, but also rejects receiver offset error. Also, low voltage operation is required in mobile applications to reduce power consumption.

Figure 1:
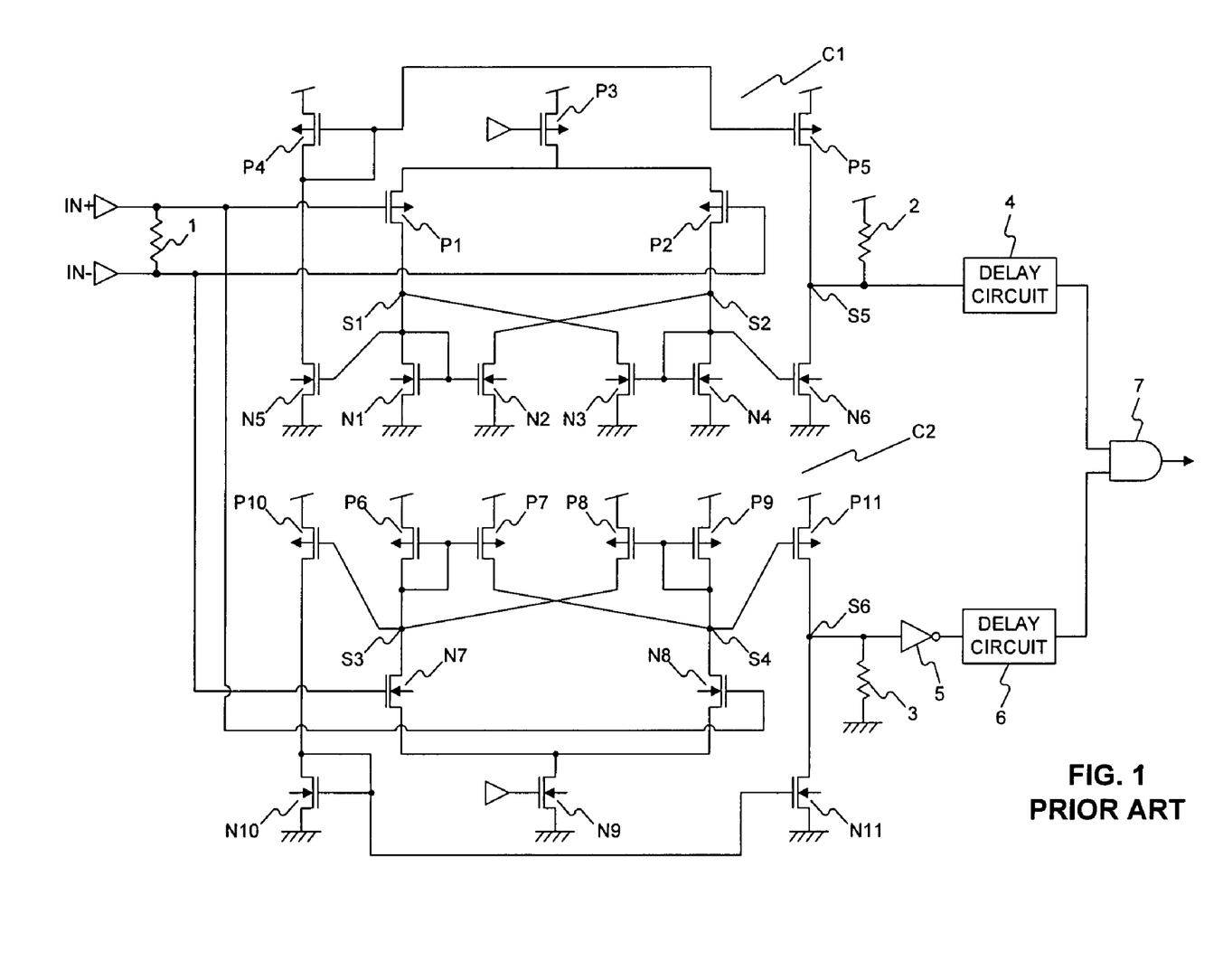
FIG. 1 illustrates a conventional differential comparator.

A conventional differential comparator is disclosed in U.S. Pat. No. 5,764,086. FIG. 1 is a reproduction of FIG. 1 of U.S. Pat. No. 5,764,086. The conventional comparator shown in FIG. 1 includes a first comparator circuit C1, a second comparator circuit C2, a pull-up resistor 2, a pull-down resistor 3, a delay circuit 4, a delay circuit 6, and a logical product gate 7. Circuit C1 has a differential input stage including "P-channel FETs" P1 and P2. Circuit C2 has a differential input stage including "N-channel FETs" N7 and N8. First comparator circuit C1 has a differential input signal receivable voltage range, e.g., 0V to 2V, that is lower than the receivable voltage range of second comparator circuit C2, e.g., 1V to 2.4V. When the differential input voltage is higher than a first threshold voltage, FETs P1 and P2 are turned off and the output of the first comparator circuit C1 has a high impedance that is pulled up to "1" by pull-up resistance 2. When the input voltage is lower than a second threshold voltage, FETs N7 and N8 are turned off and the output of the second differential comparator has a high impedance that is pulled down to "0" by pull-down resistance 3. An inverter 5, gate 7, and delay circuits 4 and 6 combine the outputs of first and second comparators circuits C1 and C2 to generate a logical output "0" or "1" according to the polarity of the differential input voltage.

One aspect of this type of conventional receiver is that a high supply voltage is required. Because the input transistor pair of each comparator circuit is connected to a common current source, the source voltage of the input transistor pair changes according to a common-mode voltage of the differential input voltage. Due to a back-gate effect, the absolute value of the threshold voltage of the transistors of the input transistor pair increases according to the common-mode voltage of the input voltage. Consequently, a higher supply voltage is required to turn on the transistors of the input transistor pair. This type of effect commonly occurs in conventional operational amplifiers and comparators, so that higher supply voltages are commonly needed for analog circuits.

Another aspect of this type of conventional receiver is that errors may result from a small amount of noise on the transmission line, or the comparator's offset error. For example, if a small amount of noise exists on the transmission line, and the noise voltage is larger than a threshold voltage (or a minimum detectable voltage), the comparator's output polarity may be switched. Consequently, the receiver detects the noise as a signal that may cause an error in an associated LSI logic circuit.

In addition, the existence of offset error can result in undesired detections by the receiver. Due to process variations between MOS transistors of the transistor pair of the differential input stage, a small difference may exist in the threshold voltages of the respective MOS transistors resulting in offset error in the receiver. Consequently, if the offset voltage is larger than a minimum signal voltage that the receiver can detect, the receiver will detect the offset error.

Figure 2:
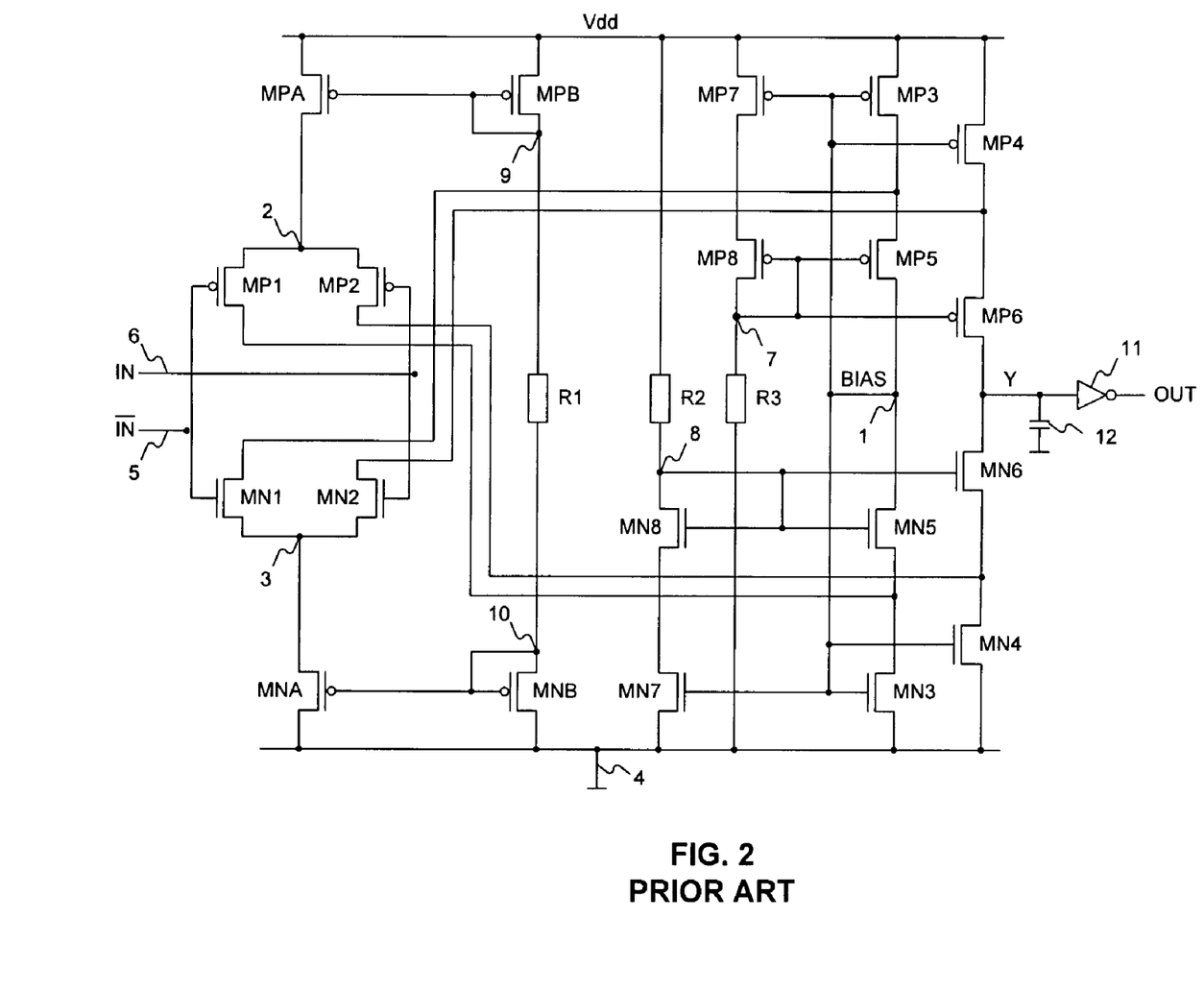
FIG. 2 illustrates another conventional differential comparator.

Another type of conventional differential comparator is disclosed in U.S. Pat. No. 6,778,014. FIG. 2 is a reproduction of FIG. 2 of U.S. Pat. No. 6,778,014. At the input of the comparator, a pair of PMOS FETs MP1 and MP2 are connected to a PMOS FET MPA that serves as a current source. Similarly, at the input, a pair of NMOS FETs MN1 and MN2 are connected to an NMOS FET MNA that serves as a current source. A differential input voltage IN, $\overline{IN}$ is applied across these pairs of FETs. As a result, the voltages at nodes 2 and 3 are changed according to a common mode voltage of the differential input voltage. The threshold voltages of transistors MP1, MP2, MN1, and MN2 may be changed according to the voltages at nodes 2 and 3 by the back-gate effect. For example, when the common-mode voltage is high, the threshold voltage of the transistors MN1 and MN2 is also high. When the common-mode voltage is low, the absolute value of the threshold voltage of transistors MP1 and MP2 is high. As a result of these higher threshold voltage, a higher supply voltage may be required to turn on these transistors. Again, a similar effect has been observed in conventional operational amplifiers.

SUMMARY OF THE INVENTION

In accordance with the invention, there is provided a comparator comprising first and second input terminals and first and second output terminals. A first inverter has an input coupled to the first input terminal and a second inverter has an input coupled to the second input terminal. A third inverter has an output coupled to an output of the first inverter and the first output terminal. A fourth inverter has an output coupled to an output of the second inverter and the second output terminal. A bias circuit is coupled between the respective outputs of the third and fourth inverters to provide first and second bias voltages. An input of the third inverter is coupled to the bias circuit to receive the first bias voltage. An input of the fourth inverter is coupled to the bias circuit to receive the second bias voltage.

Also in accordance with the invention, there is provided a comparator comprising first and second input terminals and an output terminal. A first inverter has an input coupled to the first input terminal and a second inverter has an input coupled to the second input terminal. A third inverter has an output coupled to an output of the first inverter and a fourth inverter has an output coupled to an output of the second inverter and the output terminal. A fifth inverter has an output coupled to the outputs of the first inverter and the third inverter. An input of the fifth inverter is coupled to the output of the second inverter. Inputs of the third and fourth inverters are coupled together and to the output of the third inverter.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to exemplary embodiments of the invention, which are illustrated in the accompanying drawings. Wherever possible, the same reference numbers will be used throughout the drawings to refer to the same or like parts.

Figure 3:
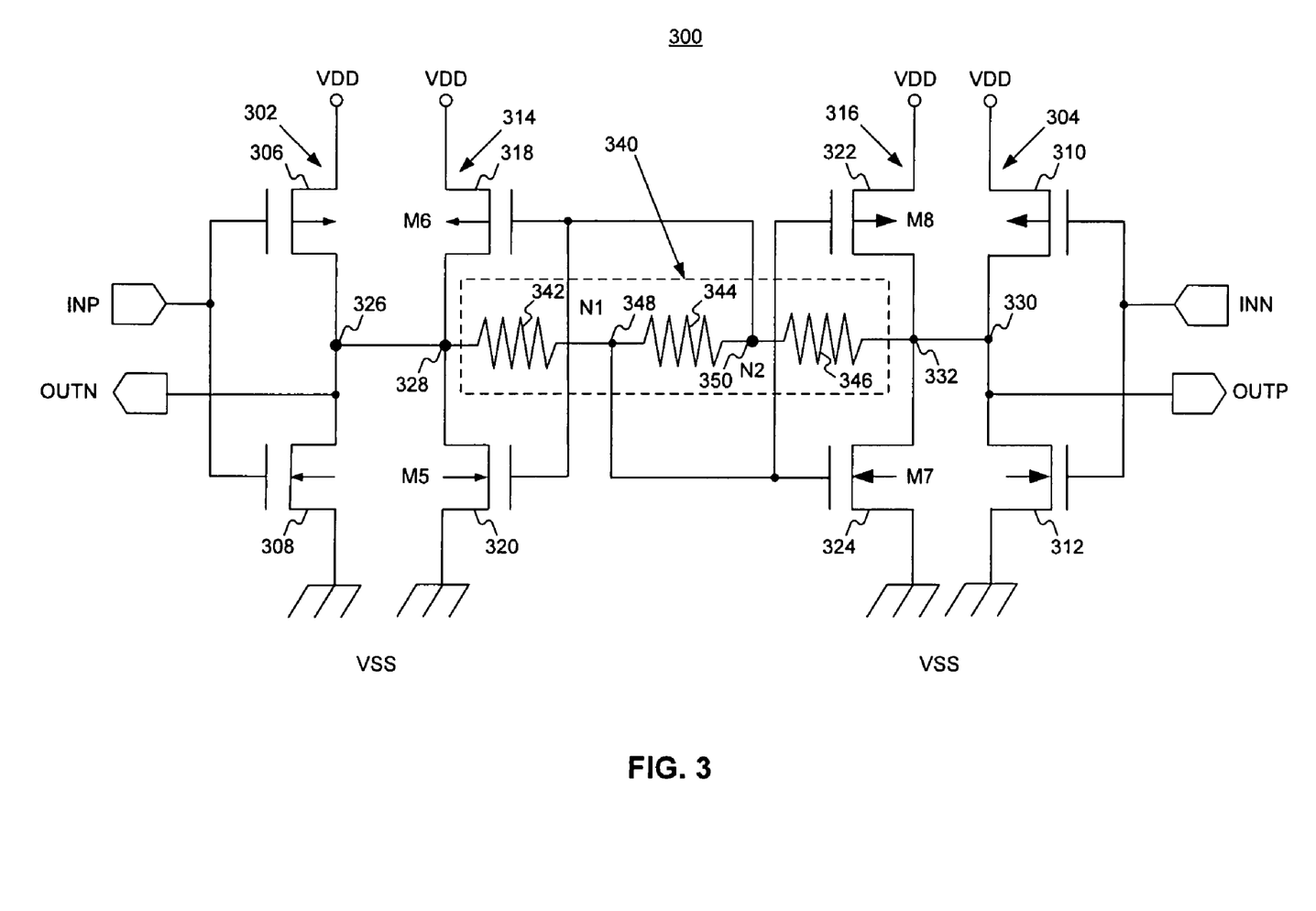
FIG. 3 illustrates a differential comparator consistent with an embodiment of the invention.

FIG. 3 illustrates a differential comparator 300 consistent with an embodiment of the present invention. With reference to FIG. 3, comparator 300 includes input terminals INP and INN and output terminals OUTN and OUTP. Input terminal INP is coupled to a CMOS input inverter 302, and input terminal INN is coupled to a CMOS input inverter 304. Inverter 302 includes a PMOS transistor 306 coupled in series with an NMOS transistor 308. The respective gates of transistors 306 and 308 constitute an input of inverter 302 and are coupled together and to input terminal INP. Inverter 304 includes a PMOS transistor 310 coupled in series with an NMOS transistor 312. The respective gates of transistors 310 and 312 constitute an input of inverter 304 and are coupled together and to input terminal INN. In one aspect of the embodiments disclosed herein, transistor pairs (306 and 310), and (308 and 312) are fabricated to have substantially the same physical dimensions such that input inverters 302 and 304 have the same physical dimensions and the same electrical characteristics.

Comparator 300 also includes a CMOS load inverter 314 and a CMOS load inverter 316. Inverter 314 includes a PMOS transistor 318 coupled in series with an NMOS transistor 320. Inverter 316 includes a PMOS transistor 322 coupled in series with an NMOS transistor 324. An output of input inverter 302 at a node 326 is coupled to both an output of load inverter 314 at a node 328 and to output terminal OUTN. An output of input inverter 304 at a node 330 is coupled to an output of load inverter 316 at a node 332 and to output terminal OUTP. In one aspect of the embodiments disclosed herein, transistor pairs (318 and 322), and (320 and 324) are fabricated to have substantially the same physical dimensions such that inverters 314 and 316 have the same physical dimension and the same electrical characteristics.

A bias control circuit 340 has three resistors 342, 344, and 346 coupled in series with each other and between output terminals OUTN and OUTP. Resistors 342 and 346 are fabricated to have the same resistance. The voltage between output terminals OUTN and OUTP is divided by resistors 342, 344, and 346 to provide bias voltages between terminals 348 and 350 of resistor 344. The respective gates of transistors 322 and 324 of load inverter 316 constitute an input of inverter 316 and are coupled together and to receive the bias voltage provided at terminal 348. The respective gates of transistors 318 and 320 of load inverter 314 constitute an input of inverter 314 and are coupled together and to receive the bias voltage provided at terminal 350.

Each of input inverters 302 and 304 and load inverters 314 and 316 are coupled between a power supply voltage VDD and a reference voltage VSS, which may be ground.

In operation, since bias control circuit 340 is coupled between output terminals OUTP and OUTN, it provides bias voltages at terminals 348 and 350 as a function of the output voltage across output terminals OUTP and OUTN. As a result, output current from each input inverter 302 and 304 that is outputted to output terminals OUTN and OUTP, respectively, is compensated by output current from each load inverter 314 and 316, respectively.

If the respective output currents from input inverters 302 and 304 are the same, and if a common-mode voltage of the differential input voltage received across input terminals INN and INP is higher than inverting voltages of input inverters 302 and 304, the output current from input inverters 302 and 304 pulls down the output voltage across comparator output terminals OUTN, OUTP. As used herein, the inverting voltage of an inverter is the inverter input voltage which, when crossed, causes the inverter to switch its output voltage. If the physical dimensions of load inverters 314 and 316 are much larger than those of input inverters 302 and 304, then the conductance of transistors 318, 320, 322, and 324 of load inverters 314 and 316 will be much larger than that of transistors 306, 308, 310, and 312 of input inverters 302 and 304, and the output voltage will not be affected by the input common mode voltages.

Thus, if it is desired to obviate effects of input common-mode voltage, comparator 300 can be constructed to provide the transistors of load inverters 314 and 316 with a higher conductance than that of the transistors of input inverters 302 and 304.

If the respective output currents from input inverters 302 and 304 are different, the voltages on the comparator output terminals OUTN, OUTP are shifted in opposite directions from the original voltage of the output voltages to compensate the output current from input inverters 302 and 304. Thus, for example, assuming, initially, that comparator output terminal OUTN is high, e.g., power supply voltage VDD, and comparator output terminal OUTP is low, e.g., reference voltage or ground VSS, this voltage difference between the output terminals causes bias control circuit 340 to generate bias voltages at terminals 348 and 350 with a voltage difference therebetween, that are applied to load inverters 316 and 314, respectively. This difference between bias voltages generates a difference in the respective output currents from load inverters 314 and 316. Since the bias voltage at terminal 348 is higher than the inverting voltage of load inverter 316, the output current from load inverter 316 pulls down output terminal OUTP. Also, since the bias voltage at terminal 350 is lower than the inverting voltage of load inverter 314, the output current from load inverter 314 pulls up output terminal OUTN. Assuming that an input voltage is applied such that input terminal INP is pulled to high and input terminal INN is pulled lower, the output current from input inverter 302 pulls down output terminal OUTN, and the output current from input inverter 304 pulls up output terminal OUTP. If a pull-down current from first input inverter 302 is larger than a pull-up current from load inverter 314, and if the pull-up current from second input inverter 304 is larger than a pull-down current of load inverter 316, output terminal OUTN is pulled down and output terminal OUTP is pulled up. Consequently, the voltage between the respective outputs of load inverters 314 and 316 is reduced, and the pull-up current from load inverter 314 and pull-down current from the load inverter 316 is reduced. Since the respective output currents from input inverters 302 and 304 do not change, comparator output terminal OUTN is pulled down further, and comparator output terminal OUTP is pulled up higher. Thus, bias control circuit 340 provides positive feedback. As a result, the output voltage on output terminal OUTN is pulled down close to VSS, and the output voltage on output terminal OUTP is pulled up close to VDD.

If the polarity of the voltage between the input terminals changes, such that the voltage at input terminal INP becomes lower than the voltage at input terminal INN, the output current of input inverter 302 pulls up output terminal OUTN, and the output current of input inverter 304 pulls down output terminal OUTP. If the pull-up current of input inverter 302 is larger than the pull-down current of load inverter 314, and the pull-down current of input inverter 304 is larger than the pull-up current of load inverter 316, then output terminal OUTN is pulled up higher, and output terminal OUTP is pulled down lower. As a result, the voltage between output terminals OUTP and OUTN is reduced, the pull-down current of load inverter 314 is reduced, and the pull-up current of load inverter 316 is reduced. Finally, output terminal OUTN is pulled up close to VDD, and output terminal OUTP is pulled down close to VSS.

Figure 4:
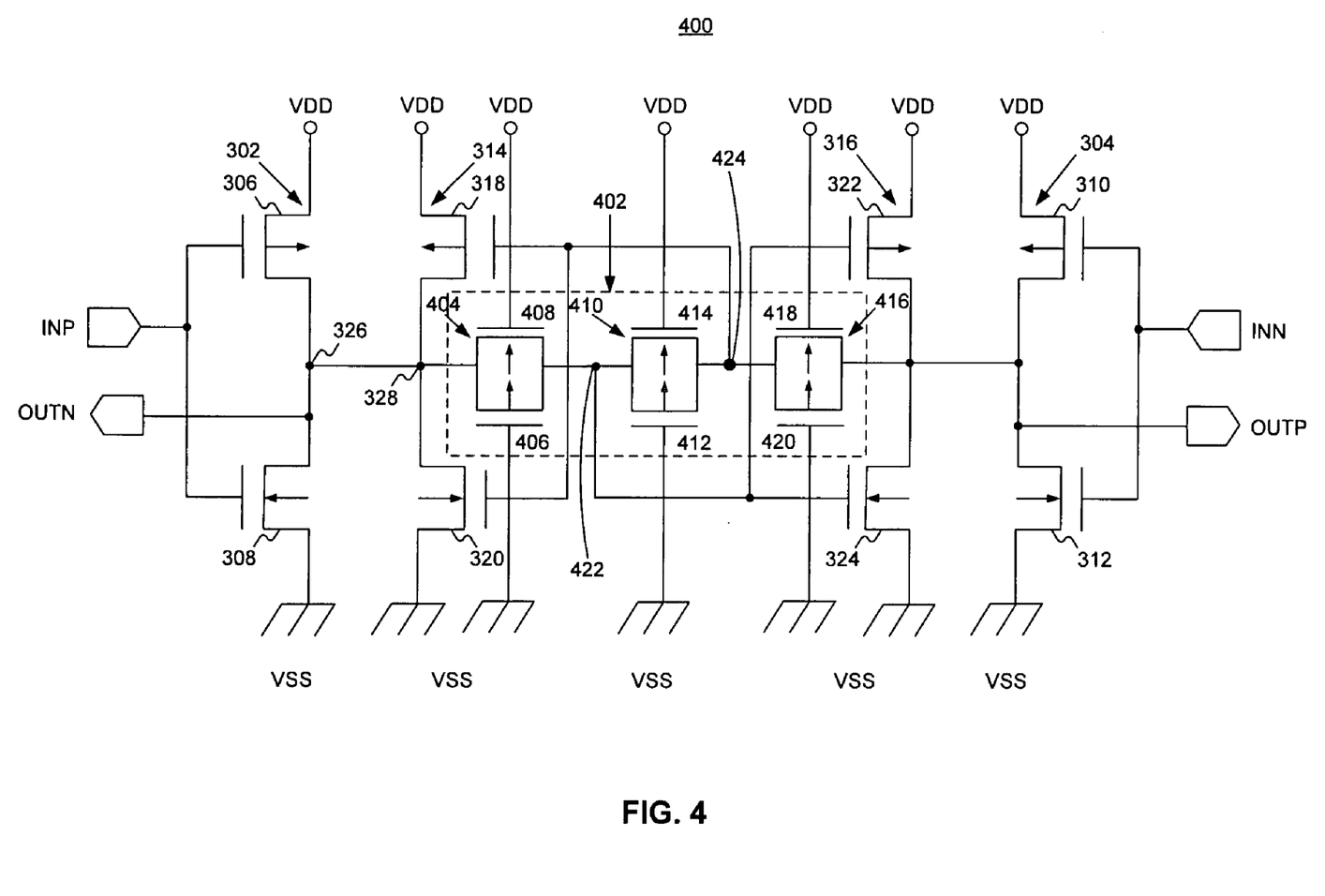
FIG. 4 illustrates a differential comparator consistent with another embodiment of the invention.

FIG. 4 illustrates a differential comparator 400 consistent with another embodiment of the invention. Comparator 400 has substantially the same construction as comparator 300 except that in place of bias control circuit 340, it includes a bias control circuit 402. Circuit 402 includes pairs of MOS transistors in place of the resistors of circuit 340. These transistor pairs include a first transistor pair 404 consisting of a PMOS transistor 406 and an NMOS transistor 408, with the source and drain of transistor 406 connected to the source and drain of transistor 408. A second transistor pair 410 consists of a PMOS transistor 412 and an NMOS transistor 414, with their sources and drains connected as in first pair 404. A third transistor pair 416 consists of a PMOS transistor 420 and an NMOS transistor 418 with their sources and drains connected as in first pair 404.

Bias control circuit 402 includes nodes 422 and 424, between the respective transistor pairs, at which bias voltages are provided during operation. The respective gates of transistors 322 and 324, which constitute the input of load inverter 316, are coupled together and to receive the bias voltage provided on node 422. The respective gates of transistors 318 and 320, which constitute the input of load inverter 314, are coupled together and to receive the bias voltage provided on node 424.

It may be desirable in certain applications to construct the bias control circuit using MOS transistors, as in circuit 402, instead of resistors, as in circuit 340, because it may not be possible to fabricate resistors with sufficiently high resistance using typical device fabrication processes. In such applications, constructing the bias control circuit using MOS transistors enables achievement of higher resistances, when desired for a particular application.

Comparator 400 operates in a manner analogous to that described above for comparator 300. Initially, if output terminal OUTN is high, e.g., VDD, and output terminal OUTP is low, e.g., VSS, PMOS transistors 406 and 412 and NMOS transistors 414 and 418 of bias control circuit 402 are "ON". Assuming that the conductance of PMOS transistor 406 and NMOS transistor 418 are the same, and that this conductance is much smaller than the sum of the conductances of NMOS transistor 414 and PMOS transistor 412, then the bias voltages at nodes 422 and 424 are set around the inverting voltage of load inverters 314 and 316, and the bias voltage at node 422 is slightly higher than the bias voltage node 424. Since the bias voltage at node 424 applied to the input of load inverter 314 is lower than the inverting voltage of load inverter 314, and the bias voltage at node 422 applied to the input of load inverter 316 is higher than the inverting voltage of load inverter 316, the output current of load inverter 314 pulls up output terminal OUTN, and the output current of load inverter 316 pulls down output terminal OUTP.

Assuming that an input voltage is applied such that input terminal INP is pulled higher and input terminal INN is pulled lower, the output current from input inverter 302 pulls down output terminal OUTN, and the output current from input inverter 304 pulls up output terminal OUTP. If the pull-down current of input inverter 302 is larger than the pull-up current of load inverter 314, then output terminal OUTN is pulled down lower. If the pull-up current of input inverter 304 is larger than the pull-down current of load inverter 316, then output terminal OUTP is pulled up higher. As a result, the voltage between output terminals OUTP and OUTN is reduced, the pull-up current of load inverter 314 is reduced, and the pull-down current of load inverter 316 is reduced. Finally, output terminal OUTN is pulled down to VSS, and output terminal OUTP is pulled up to VDD.

If the polarity of the voltage between input terminals INN and INP changes, such that the voltage at input terminal INP is lower than the voltage at input terminal INN, then the output current of input inverter 302 pulls up output terminal OUTN and the output current of input inverter 304 pulls down output terminal OUTP. If the pull-up current of the input inverter 302 is larger than the pull-down current of load inverter 314, and the pull-down current of input inverter 304 is larger than the pull-up current of the load inverter 316, then output terminal OUTN is pulled up higher and output terminal OUTP is pulled down lower. As a result, the voltage between output terminals OUTP and OUTN is reduced, the pull-down current of load inverter 314 is reduced, and the pull-up current of load inverter 316 is reduced. Finally, output terminal OUTN is pulled up to VDD and output terminal OUTP is pulled down to VSS.

As in the case of comparator 300, if it is desired to obviate the effects of input common-mode voltage, comparator 400 can be constructed to provide the transistors of load inverters 314 and 316 with a higher conductance than that of the transistors of input inverters 302 and 304. Additionally, as explained above, the conductance of transistors 406, 408, 418, and 420 should be much smaller than the sum of the conductances of transistors 412 and 414.

Figure 5:
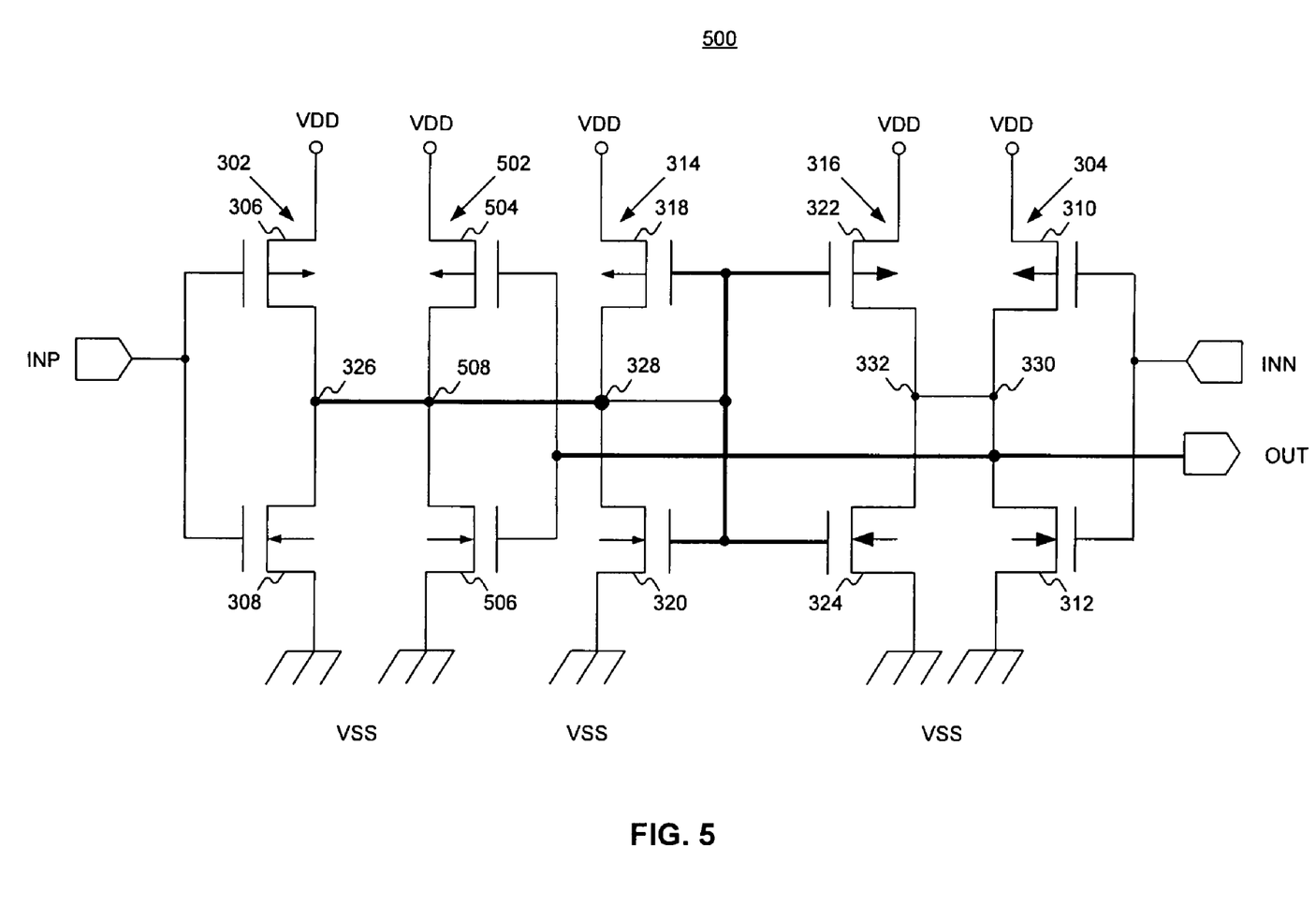
FIG. 5 illustrates a differential comparator consistent with a further embodiment of the invention.

FIG. 5 illustrates a single output differential comparator 500 consistent with a further embodiment of the invention. Comparator 500 includes input inverters 302 and 304 and load inverters 314 and 316 as previously described with respect to comparator 300. Comparator 500 further includes a feedback inverter 502 that includes a PMOS transistor 504 and an NMOS transistor 506 coupled in series. An output of feedback inverter 502 at an output node 508 between transistors 504 and 506 is coupled to the outputs of inverters 302 and 314 at nodes 326 and 328, respectively. The gates of transistors 504 and 506 constitute an input of inverter 502, are coupled together and to the output of input inverter 304 and to a single output terminal OUT. The gates of transistors 318 and 320 of load inverter 314 and the gates of transistors 322 and 324 of load inverter 316 are all coupled together and to the output of load inverter 314 at node 328.

In operation, because the gates of the transistors of load inverter 314 are coupled to the output of load inverter 314, that output is maintained at approximately the inverting voltage of the load inverter. Further, the output current of feedback inverter 502 is assumed to be smaller than the output current of input inverter 302, and the dimensions of load inverters 314 and 316 are much larger than those of input inverters 302 and 304. Initially, if the output voltage of feedback inverter 502 at output node 508 is high, e.g., VDD, and the voltage at input terminal INP is low, e.g., VSS, the voltage at output terminal OUT is low, e.g., VSS, and the voltage at input terminal INN is high, e.g., VDD, then the output current from input inverter 302 pulls up node 508 and the output current from feedback inverter 502 pulls up output node 508. The output current of load inverter 314 pulls down output node 508 to compensate the output current from input inverter 302 and feedback inverter 502. The output current of load inverter 314 is duplicated at second load inverter 316. Then the output current from load inverter 316 pulls down output terminal OUT. The output current from input inverter 304 also pulls down output terminal OUT. Since the dimensions of load inverters 314 and 316 are much larger than those of input inverters 302 and 304, the common mode voltage of input terminals INN, INP does not affect the output voltage at node 508 and output terminal OUT.

If the polarity of the voltage between input terminals INP and INN changes, such that the voltage of input terminal INP is high and the voltage of input terminal INN is low, then the output current from input inverter 302 pulls down output node 508 and the output current from input inverter 304 pulls up output terminal OUT. This reduces the pull-down current of load inverter 314 and this pull-down current of load inverter 314 is copied to load inverter 316. Then the pull-down current at output terminal OUT is reduced and the voltage of output terminal OUT is pulled up higher by input inverter 304. Since the input voltage of feedback inverter 502 is pulled higher, the pull-up current of feedback inverter 502 is reduced and this reduces the pull-down current of load inverter 314. Finally, the output voltage at output terminal OUT reaches VDD.

If the dimensions of the feedback inverter 502 are provided to be much smaller than those of input inverters 302 and 304, this ensures that input inverters 302 and 304 can change the voltage at output terminal OUT. The dimensions of the feedback inverter 502 depend on a hysteresis voltage of comparator 500. If the hysteresis voltage is small, then the dimensions of the feedback inverter 502 can also be smaller.

In each of comparators 300, 400, and 500, the pair of input inverters 302 and 304 enables each comparator to operate over a wide input voltage range. For each of input inverters 302 and 304, if the input voltage is lower than the inverting voltage of the input inverter, the output current of the input inverter is a pull-up current. If the input voltage is higher than the inverting voltage of the input inverter, then the output current of the input inverter is a pull-down current. Additionally, the output currents of input inverters 302 and 304 are compensated by the currents of load inverters 314 and 316. If the conductance of the MOS transistors of the load inverters is significantly larger than that of the input inverters and the input voltages of the load inverters are maintained around the inverting voltage of the load inverters, then the NMOS transistors and PMOS transistors of load inverters 314 and 316 are always maintained "ON."

In the cases of comparators 300 and 400, the difference between the output currents from load inverters 314 and 316 is determined by the difference between the bias voltages provided by bias control circuit 340 or 402. Moreover, the output polarity can be switched by a small differential input voltage so long as the difference of the bias voltages is sufficiently small.

Because each comparator 300, 400, and 500 utilizes two input inverters and two load inverters, the voltage range during operation is commensurate with the voltage range of typical inverters. In addition, unlike conventional OPAMPS, the two input inverters do not have a common current source. Thus, the threshold voltages of NMOS and PMOS transistors of the inverters will not be increased by input common-mode voltages.

All of the MOS transistors implemented in the input and load inverters in the illustrated embodiments operate in the pentode region, i.e., the NMOS and PMOS transistors operate in the saturation region. As a result, a minimum value of supply voltage VDD is determined using the following expression:

$$VDD > VthN + |VthP|$$

where
i. VthN is the threshold voltage of the NMOS transistors used in the comparator; and
ii. VthP is the threshold voltage of the PMOS transistors used in the comparator.

In the operation of the disclosed comparators, a hysteresis voltage is controlled either by the ratio of resistors R1-R3 of bias circuit 340 of comparator 300, or by the ratio of physical dimensions of the MOS transistors of bias circuit 402 of comparator 400. In comparator 500, the hysteresis voltage is controlled by the dimensions of feedback inverter 502. The hysteresis voltage of comparator 300 or 400 is the differential input voltage at which the current from input inverters 302 and 304 compensates the current from load inverters 314 and 316 at the stable state, i.e., OUTN=VDD(VSS) and OUTP=VSS(VDD). The hysteresis voltage of comparator 500 is the differential input voltage at which the current from input inverter 302 compensates the output current from feedback inverter 502 and load inverter 314, and the current from input inverter 304 compensates the output current from load inverter 316 at the stable state, i.e., OUT=VDD(VSS).

Comparators consistent with the invention can be implemented in normal logic processes, and the circuits can be implemented in logic LSI without any special modification. Also, because the circuitry of comparators consistent with the invention contains fewer devices than that of conventional comparators, less silicon area is needed.

The circuits of comparators consistent with the invention contain only a single stage and the transistors are normally ON. As a result, the switching time is very short.

While bias circuit 340 of comparator 300 has been illustrated as consisting of three resistors in series, the invention is not so limited. Embodiments consistent with the invention can be practiced with equal effectiveness using any resistor network that provides two bias voltages of the desired magnitudes.

While bias circuit 402 of comparator 400 has been illustrated as consisting of three pairs of MOS transistors, the invention is not so limited. Embodiments consistent with the invention can be practiced with equal effectiveness using any transistor network that provides two bias voltages of the desired magnitudes.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:
1. A comparator, comprising:
   first and second input terminals;
   first and second output terminals;

a first inverter having an input directly connected to the first input terminal;

a second inverter having an input directly connected to the second input terminal;

a third inverter having an output directly connected to an output of the first inverter and the first output terminal;

a fourth inverter having an output directly connected to an output of the second inverter and the second output terminal; and a bias circuit, directly connected between the respective outputs of the third and fourth inverters, to provide first and second bias voltages, an input of the third inverter directly connected to the bias circuit to receive the first bias voltage, an input of the fourth inverter directly connected to the bias circuit to receive the second bias voltage;

wherein the bias circuit includes a plurality of transistors, coupled between the respective outputs of the third and fourth inverters, to provide the first and second bias voltages; and the plurality of transistors include a first pair of transistors, a second pair of transistors, and a third pair of transistors, the first, second, and third pairs of transistors coupled in series, a node between the first and second pairs of transistors for providing the first bias voltage, a node between the second and third pairs of transistors for providing the second bias voltage.

2. A comparator, comprising:

first and second input terminals;

first and second output terminals;

a first input inverter having an input directly connected to the first input terminal;

a second input inverter having an input directly connected to the second input terminal;

a first load inverter having an output directly connected to an output of the first input inverter and the first output terminal;

a second load inverter having an output directly connected to an output of the second input inverter and the second output terminal; and a bias circuit, directly connected between the respective outputs of the first and second load inverters, to provide first and second bias voltages, an input of the first load inverter directly connected to the bias circuit to receive the first bias voltage, an input of the second load inverter directly connected to the bias circuit to receive the second bias voltage;

wherein the bias circuit includes a plurality of transistors, coupled between the respective outputs of the first and second load inverters, to provide the first and second bias voltages; and the plurality of transistors include a first pair of transistors, a second pair of transistors, and a third pair of transistors, the first, second, and third pairs of transistors coupled in series, a node between the first and second pairs of transistors for providing the first bias voltage, a node between the second and third pairs of transistors for providing the second bias voltage.

3. The comparator of claim 2, wherein each pair of transistors includes an NMOS transistor and a PMOS transistor, respective sources of the NMOS and PMOS transistors coupled together and respective drains of the NMOS and PMOS transistors coupled together.

4. The comparator of claim 2, wherein each of the first and second input inverters and each of the first and second load inverters are adapted for coupling between a power supply voltage and a reference voltage.

5. The comparator of claim 2, wherein each of the first and second input inverters comprises a PMOS transistor coupled in series with an NMOS transistor, physical dimensions of the first and the second input inverter being substantially the same.

6. The comparator of claim 2 wherein each of the first and second load inverters comprises a PMOS transistor coupled in series with an NMOS transistor, physical dimensions of the first and second load inverters being substantially the same.

* * * * *